(12) United States Patent
Nishimura

(10) Patent No.: US 9,147,553 B2
(45) Date of Patent: Sep. 29, 2015

(54) METHOD FOR ACQUIRING SETTLING TIME

(71) Applicant: NuFlare Technology, Inc., Yokohama (JP)

(72) Inventor: Rieko Nishimura, Kanagawa (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 14/607,630

(22) Filed: Jan. 28, 2015

(65) Prior Publication Data
US 2015/0228453 A1 Aug. 13, 2015

(30) Foreign Application Priority Data
Feb. 13, 2014 (JP) .................................. 2014-025787

(51) Int. Cl.
| | |
|---|---|
| *H01J 37/20* | (2006.01) |
| *H01J 37/304* | (2006.01) |
| *H01J 37/317* | (2006.01) |
| *H01J 37/30* | (2006.01) |
| *H01J 37/06* | (2006.01) |

(52) U.S. Cl.
CPC .............. *H01J 37/304* (2013.01); *H01J 37/06* (2013.01); *H01J 37/20* (2013.01); *H01J 37/3007* (2013.01); *H01J 37/3174* (2013.01); *H01J 2237/063* (2013.01); *H01J 2237/15* (2013.01); *H01J 2237/2007* (2013.01); *H01J 2237/31725* (2013.01)

(58) Field of Classification Search
CPC H01J 37/3174; H01J 37/3026; H01J 37/3023
USPC ....... 250/492.22, 492.1, 492.3, 492.2, 396 R, 250/398, 491.1, 492.23; 430/942; 355/52, 355/53
See application file for complete search history.

(56) References Cited

U.S. PATENT DOCUMENTS

| | | | | |
|---|---|---|---|---|
| 5,134,300 | A | * | 7/1992 | Kai et al. .................... 250/492.2 |
| 5,148,033 | A | * | 9/1992 | Yamada et al. ............. 250/492.2 |
| 5,610,406 | A | * | 3/1997 | Kai et al. .................... 250/492.22 |
| 5,644,138 | A | * | 7/1997 | Hamaguchi ............... 250/492.22 |
| 6,015,975 | A | * | 1/2000 | Kawakami et al. ....... 250/492.22 |
| 6,344,655 | B1 | * | 2/2002 | Sakazaki et al. ........... 250/492.2 |
| 6,399,954 | B1 | * | 6/2002 | Seto et al. ................. 250/492.22 |
| 6,495,841 | B1 | * | 12/2002 | Ando et al. .............. 250/492.23 |

(Continued)

FOREIGN PATENT DOCUMENTS

JP 2010 74039 4/2010

*Primary Examiner* — David A Vanore
(74) *Attorney, Agent, or Firm* — Oblon, McClelland, Maier & Neustadt, L.L.P.

(57) ABSTRACT

A method for acquiring a settling time includes forming, using a deflector, a reference pattern so that a deflection movement amount of the beam may be smaller than an evaluation deflection movement amount; forming, while variably setting the settling time of the DAC amplifier, an evaluation pattern such that both ends of the width dimension of the evaluation pattern being the same design width dimension as that of the reference pattern, for each of times set variably, such that a deflection movement amount of a second beam shot of two beam shots successively shot is equivalent to the evaluation deflection movement amount; calculating a difference between the width dimension of the evaluation pattern concerned and that of the reference pattern, for each of the times set variably; and acquiring a settling time of the DAC amplifier necessary for the deflection movement amount, using the difference.

10 Claims, 10 Drawing Sheets

(56) References Cited

U.S. PATENT DOCUMENTS

| | | | |
|---|---|---|---|
| 7,476,881 B2* | 1/2009 | Hattori et al. | 250/492.22 |
| 7,605,383 B2* | 10/2009 | Horiuchi et al. | 250/492.22 |
| 7,750,324 B2* | 7/2010 | Oogi et al. | 250/492.22 |
| 7,923,699 B2* | 4/2011 | Inoue | 250/398 |
| 8,183,544 B2* | 5/2012 | Tsuruta et al. | 250/492.22 |
| RE44,179 E* | 4/2013 | Abe et al. | 250/492.22 |
| 8,421,040 B2* | 4/2013 | Takekoshi | 250/492.22 |
| 8,552,405 B2* | 10/2013 | Kato et al. | 250/492.22 |
| 8,563,953 B2* | 10/2013 | Nakayamada et al. | 250/492.23 |
| 8,791,432 B2* | 7/2014 | Matsumoto | 250/492.22 |
| 8,803,108 B2* | 8/2014 | Nishimura | 250/491.1 |
| 8,872,139 B2 | 10/2014 | Nishimura et al. | |
| 2012/0085940 A1* | 4/2012 | Matsumoto | 250/492.3 |
| 2014/0284500 A1* | 9/2014 | Nishimura et al. | 250/492.2 |
| 2014/0291553 A1* | 10/2014 | Nakayamada et al. | 250/492.3 |
| 2014/0346369 A1* | 11/2014 | Matsumoto | 250/398 |
| 2015/0041671 A1* | 2/2015 | Motosugi et al. | 250/396 R |
| 2015/0060690 A1* | 3/2015 | Yashima | 250/396 R |

* cited by examiner

METHOD FOR ACQUIRING SETTLING TIME

CROSS-REFERENCE TO RELATED APPLICATION

This application is based upon and claims the benefit of priority from the prior Japanese Patent Application No. 2014-025787 filed on Feb. 13, 2014 in Japan, the entire contents of which are incorporated herein by reference.

BACKGROUND OF THE INVENTION

1. Field of the Invention

Embodiments of the present invention relate generally to a method for acquiring a settling time, and more specifically, relate to a method for acquiring a settling time of a deflection amplifier for electron beam deflection in an electron beam writing apparatus, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 10 is a conceptual diagram explaining operations of a variable shaping type electron beam writing or "drawing" apparatus. The variable shaping type electron beam (EB) writing apparatus operates as described below. A first aperture plate 410 has a quadrangular opening 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the X direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the X direction. This method of forming a given shape by letting beams pass through both the aperture 411 of the first aperture plate 410 and the variable shape aperture 421 of the second aperture plate 420 is referred to as a variable shaped beam (VSB) system.

When performing writing in a writing apparatus, a charged particle beam such as an electron beam is deflected by a deflector, where a DAC (digital/analog converter) amplifier is used for deflecting the beam. Beam deflection using the DAC amplifier serves, for example, for controlling the shape and size of a beam shot, controlling the position of a beam shot, and blanking of a beam. For performing the beam deflection, it is necessary to set a settling time of a DAC amplifier needed to accurately perform deflection by a set movement amount without an error. If the settling time is insufficient, an error occurs in the deflection movement amount. By contrast, if the settling time is too long, the throughput degrades. Therefore, it is desirable to set a settling time to be as short as possible within the range where no error occurs.

With high accuracy and miniaturization of circuit patterns typified by semiconductor devices in recent years, higher writing accuracy and higher throughput are also needed for an electron beam writing apparatus. Therefore, even slight positional variation of a pattern written on a desired position on the mask by beam deflection described above affects dimension accuracy in manufacturing semiconductor circuits. Thus, it is necessary to optimize the settling time described above in beam deflection using a DAC amplifier, especially with respect to control of the shot position. Conventionally, a writing position is measured by a position measuring device, and then, a settling time is set in a manner such that no positional deviation occurs within a range measurable by the position measuring device (refer to, e.g., Japanese Patent Application Laid-open (JP-A) No. 2010-074039).

However, with future further miniaturization and higher accuracy, it is becoming difficult to achieve highly accurate evaluation of the settling time by the method described above.

BRIEF SUMMARY OF THE INVENTION

According to one aspect of the present invention, a method for acquiring a settling time includes: forming, using a deflector that deflects a charged particle beam based on a deflection signal from a DAC (digital/analog converter) amplifier, a reference pattern in a manner such that both ends of a width dimension of the reference pattern are written by two beam shots which are different from each other, by setting a settling time of the DAC amplifier to be a first time and deflecting the charged particle beam onto a target object by the deflector so that a deflection movement amount of the charged particle beam is smaller than an evaluation deflection movement amount for evaluating the settling time of the DAC amplifier; forming, while variably setting the settling time of the DAC amplifier to be a plurality of second times which are different from each other, an evaluation pattern in a manner such that both ends of a width dimension of the evaluation pattern being the same design width dimension as that of the reference pattern are written by two beam shots which are successively shot, by deflecting the charged particle beam onto the target object by the deflector, for each of the plurality of second times set variably, such that a deflection movement amount of a second beam shot of the two beam shots which are successively shot is equivalent to the evaluation deflection movement amount for evaluating the settling time of the DAC amplifier; measuring the width dimension of the reference pattern; measuring the width dimension of the evaluation pattern for each of the plurality of second times set variably; calculating a difference between the width dimension of the evaluation pattern concerned and the width dimension of the reference pattern, for each of the plurality of second times set variably; and acquiring a settling time of the DAC amplifier necessary for performing deflection by the deflection movement amount, using the difference for each of the plurality of second times.

DETAILED DESCRIPTION OF THE INVENTION

First Embodiment

In the first embodiment, there will be described a method for acquiring a more suitable settling time while maintaining high accuracy of shot position precision of a pattern to be written.

In the first embodiment, there will be described a configuration in which an electron beam is used as an example of a charged particle beam. The charged particle beam is not limited to the electron beam, and other charged particle beam such as an ion beam may also be used. Moreover, a variable shaped beam type writing apparatus will be described as an example of a charged particle beam apparatus.

Figure 1:
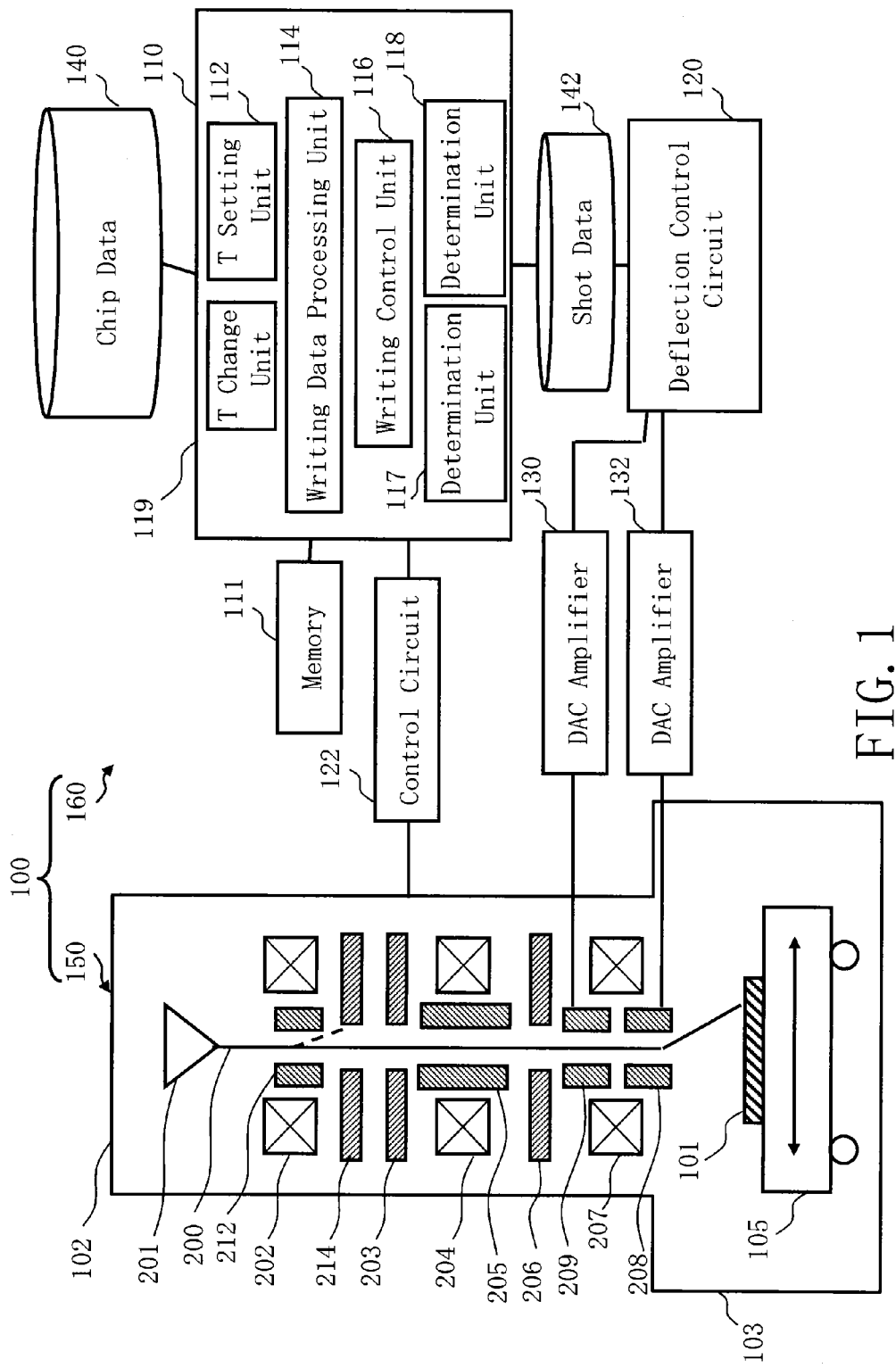
FIG. 1 is a schematic diagram showing a configuration of a writing apparatus according to the first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, is an example of a variable shaped beam (VSB) type writing apparatus. The writing unit 150 includes an electron optical column 102 and a writing chamber 103. In the electron optical column 102, there are arranged an electron gun assembly 201, an illumination lens 202, a blanking deflector 212, a blanking aperture plate 214, a first aperture plate 203, a projection lens 204, a deflector 205, a second aperture plate 206, an objective lens 207, a main deflector 208, and a sub deflector 209. In the writing chamber 103, there is arranged an XY stage 105. A target object or "sample" 101, such as a mask, on which resist is applied and which is to be written is placed on the XY stage 105. The target object 101 is, for example, an exposure mask used for manufacturing semiconductor devices. The target object 101 may be, for example, a mask blank on which resist is applied and no pattern has yet been written.

The control unit 160 includes a control computer 110, a memory 111, a deflection control circuit 120, a control circuit 122, a DAC (digital/analog converter) amplifiers 130 and 132, and storage devices 140 and 142 such as magnetic disk drives. The control computer 110, the memory 111, the deflection control circuit 120, the control circuit 122, and the storage devices 140 and 142 are mutually connected through a bus (not shown).

In the control computer 110, there are arranged a settling time T setting unit 112, a writing data processing unit 114, a writing control unit 116, a determination unit 117, a determination unit 118, and a settling time T change unit 119. Each function of them may be configured by hardware such as an electric circuit or by software such as a program causing a computer to implement these functions. Alternatively, the function may be configured by a combination of hardware and software. Data which is input and output to/from the settling time T setting unit 112, the writing data processing unit 114, the writing control unit 116, the determination unit 117, the determination unit 118, and the settling time T change unit 119 and data being operated are stored in the memory 111 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Moreover, input devices, such as a mouse and a keyboard, a monitoring device, an external interface circuit, etc. may be connected to the writing apparatus 100.

Figure 2:
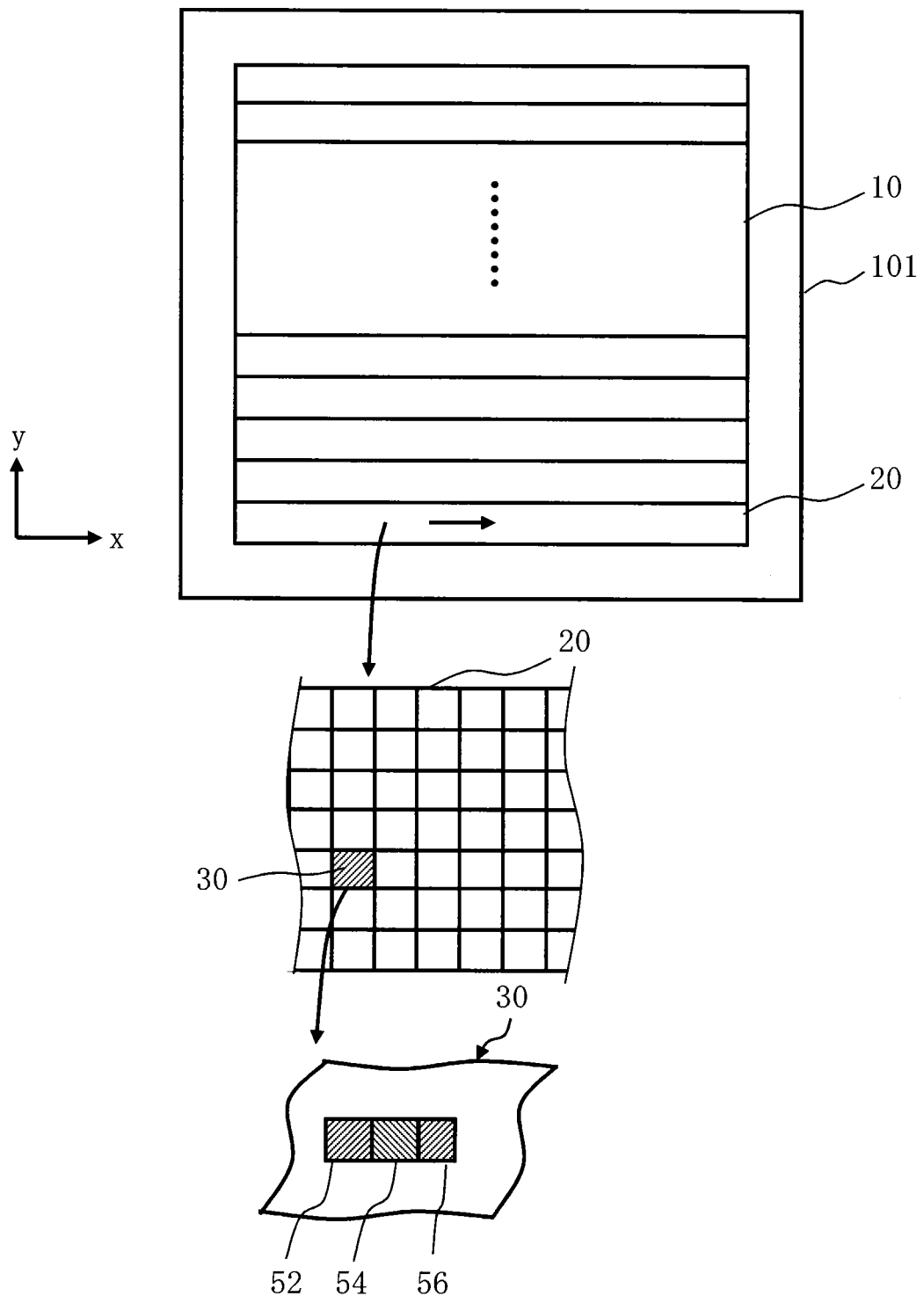
FIG. 2 is a conceptual diagram for explaining each region according to the first Embodiment.

FIG. 2 is a conceptual diagram for explaining each region according to the first Embodiment. In FIG. 2, a writing region 10 of the target object 101 is virtually divided into a plurality of strip-shaped stripe regions 20 in the y direction, for example, each having a width deflectable by the main deflector 208. Further, each of the stripe regions 20 is virtually divided into a plurality of mesh-like subfields (SFs) 30 (small regions) each having a size deflectable by the sub deflector 209. Shot FIGS. 52, 54, and 56 are written at corresponding shot positions in each SF 30.

A digital signal for blanking control is output from the deflection control circuit 120 to a DAC amplifier (not shown) for blanking control. Then, in the DAC amplifier for blanking control, the digital signal is converted to an analog signal, and amplified to be applied as a deflection voltage to the blanking deflector 212. An electron beam 200 is deflected by this deflection voltage in order to perform switching On or Off the beam, thereby forming each beam shot.

A digital signal for shaping deflection control is output from the deflection control circuit 120 to a DAC amplifier (not shown) for shaping deflection control. Then, in the DAC amplifier for shaping deflection control, the digital signal is converted to an analog signal and amplified to be applied as a deflection voltage to the deflector 205. By this deflection voltage, the electron beam 200 is deflected. Specifically, the electron beam 200 having passed through the first aperture plate 203 is deflected and controlled so as to pass through a specified position of the opening of the second aperture plate 206, thereby variably shaping each beam shot.

A digital signal for main deflection control is output from the deflection control circuit 120 to the DAC amplifier 132. Then, in the DAC amplifier 132, the digital signal is converted to an analog signal and amplified to be applied as a deflection voltage to the main deflector 208. The electron beam 200 is deflected by this deflection voltage, and thereby each beam shot is deflected to a reference position in a predetermined subfield (SF) 30 in the virtually divided mesh like subfields 30.

A digital signal for sub deflection control is output from the deflection control circuit 120 to the DAC amplifier 130. Then, in the DAC amplifier 130, the digital signal is converted to an analog signal and amplified to be applied as a deflection voltage to the sub deflector 209. The electron beam 200 is deflected by this deflection voltage, and thereby each beam shot is deflected to each shot position in a predetermined subfield (SF) in the virtually divided mesh like subfields.

The writing apparatus 100 performs writing processing in each stripe region 20 by using a multiple stage deflector. In this case, a two-stage deflector composed of the main deflector 208 and the sub deflector 209 is used as an example. While the XY stage 105 is continuously moving in the −x direction, for example, a pattern is written in the first stripe region 20 in the x direction. After the pattern writing in the first stripe region 20 has been completed, a pattern is written in the second stripe region 20 in the same or opposite direction. Then, in the same way, patterns are written in the third and subsequent stripe regions 20. The main deflector 208 deflects the electron beam 200 in sequence to a reference position A of the SF 30 so as to follow the movement of the XY stage 105. The sub deflector 209 deflects the electron beam 200 from the reference position A of each SF 30 to each shot position of an irradiating beam in the SF 30 concerned. Thus, the sizes of the deflection regions of the main deflector 208 and the sub deflector 209 are different from each other. The SF 30 is the minimum deflection region in the deflection regions of the multiple stage deflector.

In the first embodiment, there will be described with a focus on a method of acquiring the optimum settling time to be set to the DAC amplifier 130 for the sub deflector 209 that deflects the electron beam 200 to each shot position in the SF 30 used as the minimum deflection region.

Figure 3:
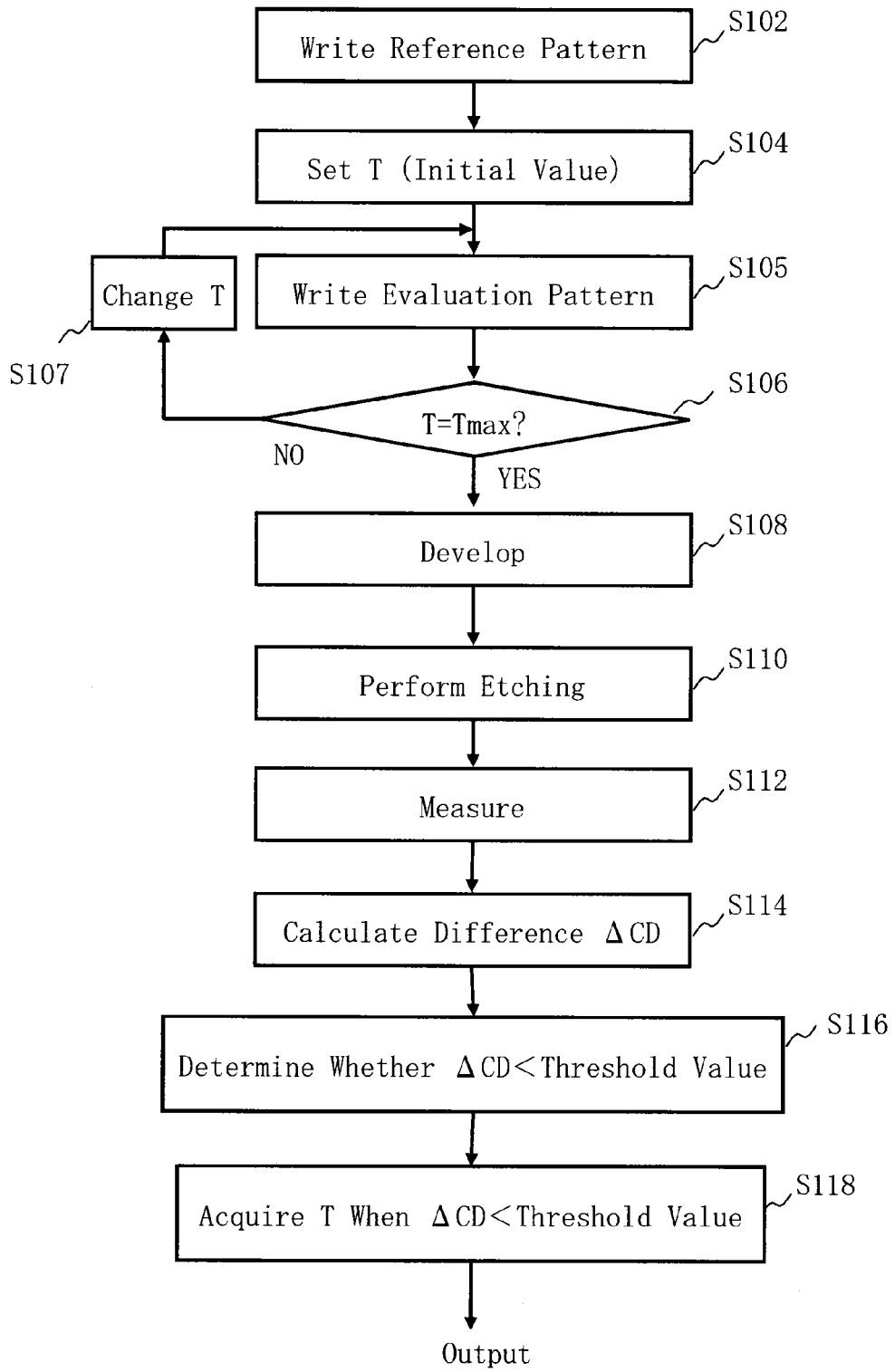
FIG. 3 is a flowchart showing main steps of an acquisition method of a settling time of a DAC amplifier according to the first embodiment.

FIG. 3 is a flowchart showing main steps of an acquisition method of a settling time of a DAC amplifier according to the first embodiment. In FIG. 3, the acquisition method of the settling time of the DAC amplifier according to the first embodiment executes a series of steps: a reference pattern writing step (S102), a settling time setting step (S104), an evaluation pattern writing step (S105), a determination step (S106), a settling time change step (S107), a development step (S108), an etching step (S110), a measurement step (S112), a difference ΔCD calculation step (S114), a determination step (S116), and a settling time acquisition (determination) step (S118).

In the reference pattern writing step (S102), first, the T setting unit 112 sets the settling time of the DAC amplifier 130 to be a time $T_0$ (first time). A reference pattern is formed by a plurality of beam shots. The amount of deflection movement between each beam shot is set to be smaller than a deflection movement amount Q (evaluation deflection movement amount) for evaluating the settling time T of the DAC amplifier 130.

A reference pattern is written (formed) in a manner such that both the ends of the width dimension are written by two beam shots which are different from each other, by deflecting the electron beam 200 onto the target object 101 by the sub deflector 209 so that the amount of deflection movement may be smaller than an evaluation deflection movement amount for evaluating the settling time of the DAC amplifier 130, by using the sub deflector 209 that deflects the electron beam 200 based on a deflection signal from the DAC amplifier 130.

Figure 4:
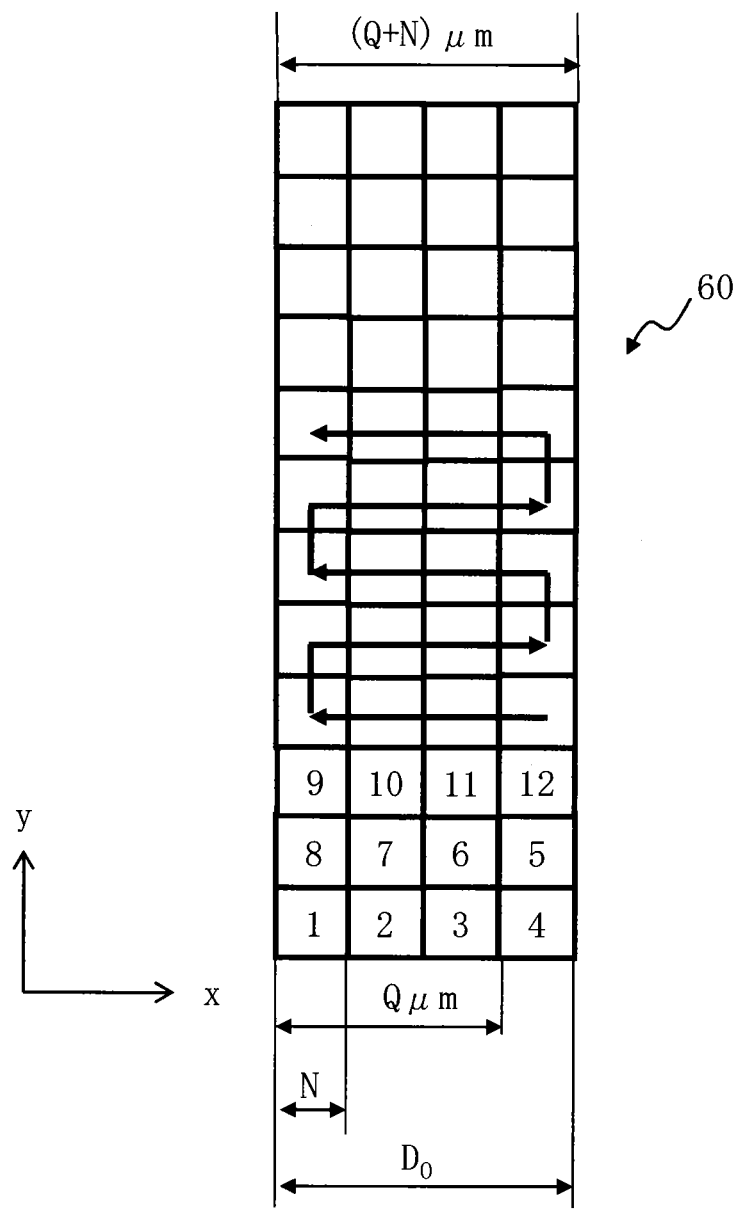
FIG. 4 shows an example of a reference pattern according to the first embodiment.

FIG. 4 shows an example of a reference pattern according to the first embodiment. In FIG. 4, a reference pattern 60 is set to have a width dimension $D_0$ equivalent to four shots of the electron beam, for example. The width dimension $D_0$ is set to be four times a beam width size N (shot size or beam width dimension) of the electron beam of each shot, and therefore the width dimension $D_0$ is 4N. In this case, the pitch between the two shots that form both the ends of the reference pattern 60 is assumed to be a deflection movement amount Q for evaluation (evaluation deflection movement amount) with respect to an evaluation pattern described later. In other words, the width dimension $D_0$ is a value obtained by adding the deflection movement amount Q and the beam width size N for one shot, that is $D_0 = Q+N$. For example, if N=0.1 μm, Q and $D_0$ are to be Q=0.3 μm and $D_0$=0.4 μm in the case of FIG. 4. Although the deflection movement amount Q is set to be 3N in the example of FIG. 4, it is not limited thereto, and may be larger or smaller than 3N. It is preferable for the shot size N to be large in the case of Q=N, for example.

The width dimension $D_0$ in the x direction of the reference pattern 60 is formed by four successive beam shots, for example. Each beam of the four shots is shot in a manner such that the end portion of each beam contacts that of an adjacent beam. In other words, successive shooting is performed by the pitch P=N. In the example of FIG. 4, the first row of the rows arrayed in the y direction of the reference pattern 60 is formed by successive four beam shots (denoted by 1, 2, 3, and 4 of FIG. 4) from the left end to the right. The second row is formed by successive four beam shots (denoted by 5, 6, 7, and 8 of FIG. 4) from the right end to the left. Shooting is subsequently repeated in a similar way, and thereby the reference line of the reference pattern is configured by a combination of patterns, formed by a plurality of beam shots, arrayed in the y direction orthogonal to the width dimension $D_0$ in the x direction.

Here, the amount of deflection movement of each shot in the case of forming the reference pattern 60 is, for example, the size N for one shot, which is sufficiently small. Therefore, even if the time $T_0$ (first time) is set to be short and thus settling is insufficient, a positional error between two shots in the x direction is consequently small. That is, the time $T_0$ (first time) may be set to be sufficiently long or alternatively may be set to be short. As described above, in the example of FIG. 4, since the successive shooting is repeated such that the end portion of each shot contacts that of an adjacent beam, optimization of the settling time can be omitted when forming the reference pattern 60. In the case where the shot size N is large, for example, to be N=0.3 μm or more, since a positional error between two shots due to shortage of settling time is not an acceptable level, it is recommended to set the time $T_0$ (first time) to be a sufficient settling time.

Pattern data of a chip 1 on which the reference pattern 60 is formed is input from the outside and stored in the storage device 140. In order to write the chip pattern of the chip 1, the writing apparatus 100 operates as described below. First, the writing data processing unit 114 reads pattern data (writing data 1) of the chip 1 from the storage device 140, and performs data conversion processing of a plurality of steps so as to generate apparatus-specific shot data. The pattern data of the chip 1 defines the reference pattern 60 shown in FIG. 4. Then, in order to write figure patterns by the writing apparatus 100, it needs to divide the reference pattern 60 defined in the pattern data of the chip 1 into sizes each of which can be irradiated by one beam shot. Thus, for actually performing writing, the writing data processing unit 114 divides each figure pattern into shot sizes each being N that can be irradiated by one beam shot in order to generate shot figures. Shot data is generated for each shot figure. In the shot data, for example, figure data such as a figure type, a figure size, and an irradiation position is defined. In addition, an irradiation time in accordance with a dose is also defined. The generated shot data is sorted in the storage device 142. In the case of FIG. 4, the reference pattern 60 is divided into a plurality of quadrangular shot figures.

Next, the writing control unit 116 controls the deflection control circuit 120 and the control circuit 122 to output a control signal so that writing processing of shot data corresponding to the chip pattern of the chip 1 may be performed. In the deflection control circuit 120, shot data is read from the storage device 142 to generate main deflection data and sub deflection data for each shot figure, in accordance with irradiation position data defined in the shot data. The main deflection data is output to the DAC amplifier 132, and the sub deflection data is output to the DAC amplifier 130. At this time, a control signal is output to the DAC amplifier 130 so that the settling time T of the DAC amplifier 130 may be equivalent to the time $T_0$ described above. The deflection control circuit 120 generates blanking data, for each shot figure, according to the irradiation time defined in the shot data, and outputs the blanking data to a DAC amplifier for blanking (not shown). Moreover, the deflection control circuit 120 generates shaping data according to the figure type and figure size defined in the shot data, and outputs the shaping data to a DAC amplifier for beam shaping (not shown). Then, based on a signal from each DAC amplifier controlled by the control circuit 122 and the deflection control circuit 120, the writing unit 150 writes a figure pattern concerned on the target object 100 with the electron beam 200. Specifically, it operates as described below.

The electron beam 200 emitted from the electron gun assembly 201 (an emission unit) is controlled by the blanking deflector 212 when passing through the blanking deflector 212 which is controlled by a deflection signal from the DAD amplifier for blanking, to pass through the blanking aperture plate 214 when in a "beam on" state, and to be deflected such that the entire beam is blocked by the blanking aperture plate 214 when in a "beam off" state. The electron beam 200 that has passed through the blanking aperture plate 214 during the period from the "beam off" state to the "beam on" state and subsequently changing again to the "beam off" state serves as one shot of the electron beam. The blanking deflector 212 controls the direction of the passing electron beam 200 to alternately generate the "beam on" state and the "beam off" state. For example, no voltage should be applied when in the "beam on" state, and a voltage should be applied to the blanking deflector 212 when in the "beam off" state. The dose per shot of the electron beam 200 to irradiate the target object 101 is adjusted depending upon an irradiation time t of each shot.

As described above, each shot of the electron beam 200, generated by passing through the blanking deflector 212 and the blanking aperture plate 214, irradiates the whole of the first shaping aperture plate 203 having a quadrangular opening by the illumination lens 202. Here, the electron beam 200 is first shaped to a quadrangle. Then, after having passed through the first shaping aperture plate 203, the electron beam 200 of the first aperture image is projected onto the second shaping aperture plate 206 by the projection lens 204. The first aperture image on the second shaping aperture plate 206 is deflection controlled by the deflector 205 so as to change (variably shape) the beam shape and the beam size. Such variable beam shaping is performed for each shot, and, generally, each shot is shaped to have a different shape and size. However, in this case, since the reference pattern 60 is divided into figures each of the same shot size, the shapes of the shot figures are the same. Then, after having passed through the second shaping aperture plate 206, the electron beam 200 of the second aperture image is focused by the objective lens 207, and deflected by the main deflector 208 and the sub deflector 209 to reach a desired position on the target object 101 placed on the XY stage 105 moving continuously. FIG. 1 shows the case of using multiple stage deflection of the main and sub deflection for position deflection. In such a case, the electron beam 200 of a shot concerned should be deflected to a reference position in the SF 30 by the main deflector 208 while following the movement of the stage, and the beam of the shot concerned should be deflected to each irradiation position in the SF by the sub deflector 209. The reference pattern 60 shown in FIG. 4 is written by repeating such operations and combining the shot figure of each shot.

Figure 5:
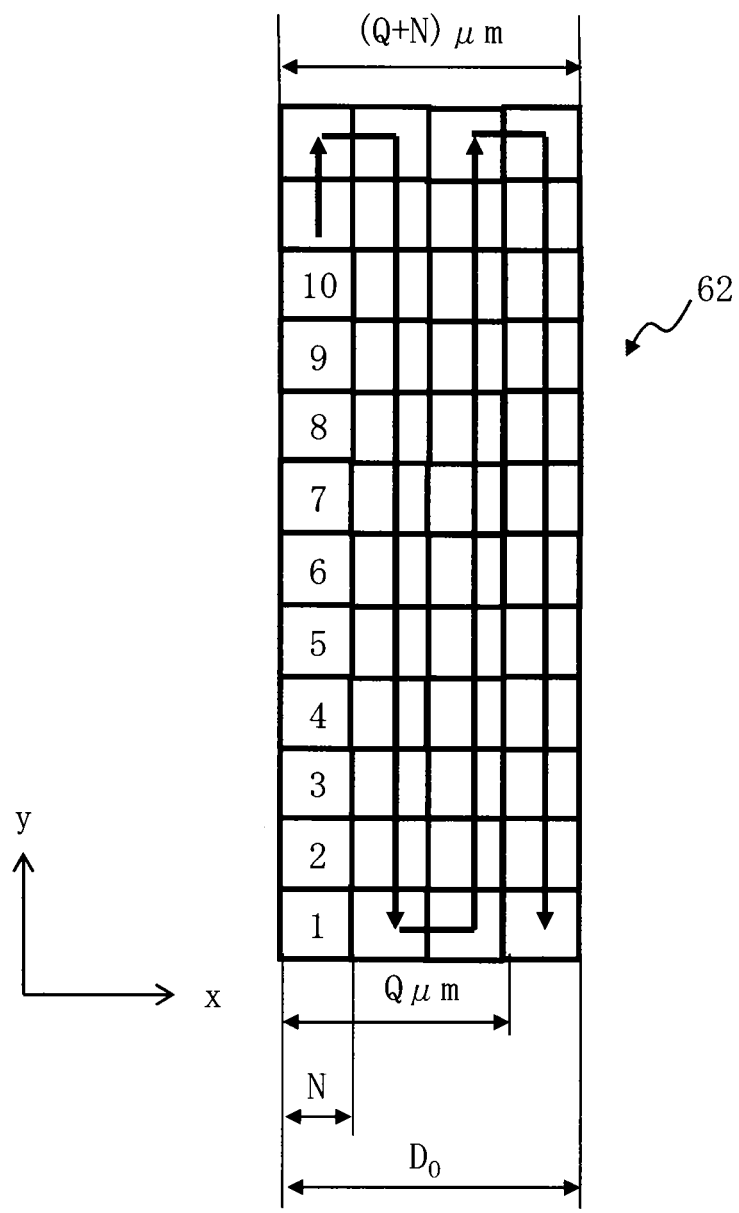
FIG. 5 shows another example of the reference pattern according to the first embodiment.

FIG. 5 shows another example of the reference pattern according to the first embodiment. In FIG. 5, similarly to FIG. 4, a reference pattern 62 is set to have a width dimension $D_0$ equivalent to four shots of electron beam. However, the writing order of each shot with respect to the reference pattern 62 differs from the case of FIG. 4. The reference pattern 62 is formed by a plurality of successive beam shots (denoted by 1, 2, 3, 4, . . . , 10 of FIG. 5) in the y direction from the left bottom end in the first column. Thereby, the first column is formed by a plurality of beam shots in the y direction. Then, the second column is formed by a plurality of successive beam shots in the −y direction from the top to the bottom. Shooting is subsequently repeated in a similar way, and thereby the reference line of the reference pattern is configured by a combination of patterns formed by a plurality of beam shots in the y direction orthogonal to the width dimension $D_0$ in the x direction. The beam between each shot is shot such that the end portion of each beam contacts that of an adjacent beam. Successive shooting is performed by the pitch P=N. In other words, a reference line pattern is formed by successive shots contacting each other in the y direction orthogonal to the width dimension $D_0$.

As described above, the reference line pattern shown in FIG. 5 is formed by shooting a beam in order such that the beam is moved in the y direction orthogonal to the width dimension $D_0$ in the x direction. By forming the reference pattern 62 by the writing order described above, since the deflection direction is the y direction, deflection errors in the x direction can be eliminated. Moreover, also in the example of FIG. 5, since the successive shooting is repeated such that the end portion of each shot contacts each other, the time $T_0$ (first time) may be set to be short. Therefore, optimization of the settling time can be omitted when forming the reference pattern 62. Since there is no movement in the x direction in the example of FIG. 5, even when the shot size N is large, for example, to be N=0.3 μm or more, the time $T_0$ (first time) may be set to be short.

Figure 6:
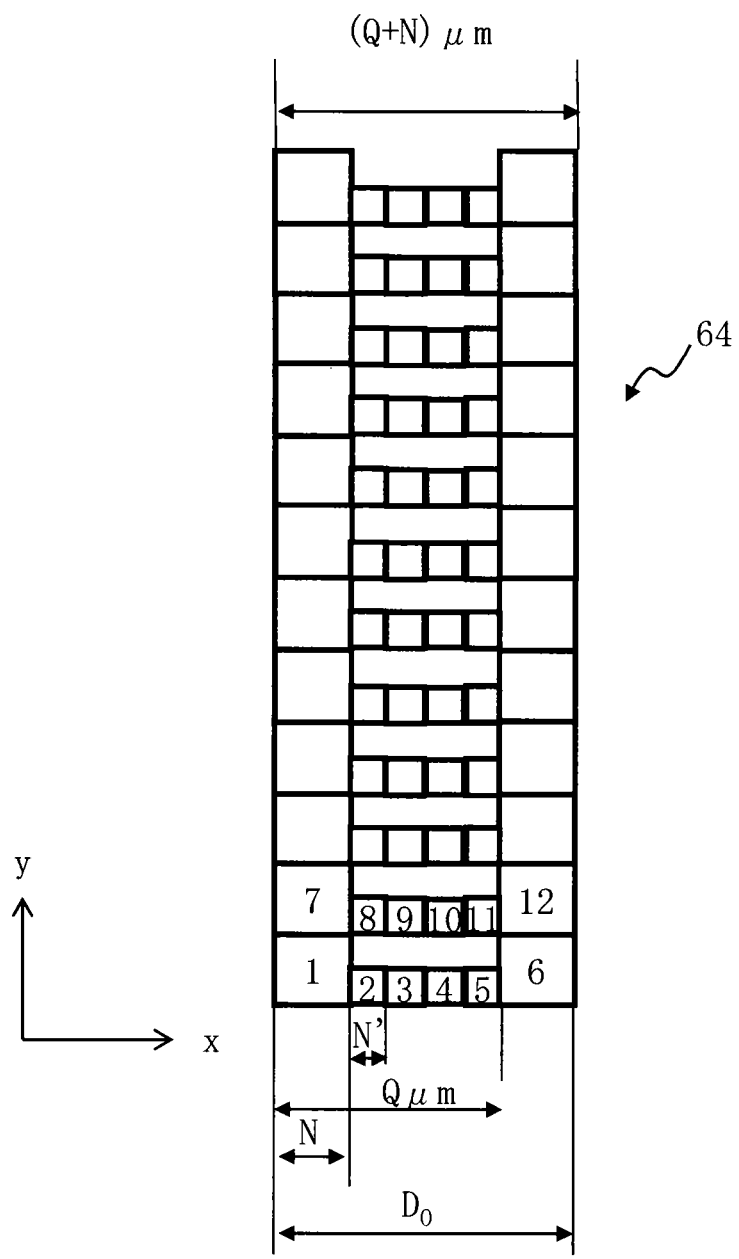
FIG. 6 shows another example of the reference pattern according to the first embodiment.

FIG. 6 shows another example of the reference pattern according to the first embodiment. In FIG. 6, similarly to FIG. 4, a reference pattern 64 is set to have a width dimension $D_0$ equivalent to four shots of the electron beam each having a shot size N. However, as for the reference pattern 64, each of the two shots at both the ends is formed by the beam of a shot size N, and the space between the both ends is written by beams each have the shot size N' smaller than the shot size N. Thus, the reference pattern 64 is formed by three or more beam shots in the width dimension $D_0$ direction (x direction), and the space between the two beam shots writing both the ends of the width dimension $D_0$ is written by the beam shots each have the shot size N' smaller than the shot size N being each of the two shots at both the ends. With respect to the reference pattern 64, the first row of the rows arrayed in the y direction is formed by a plurality of successive beam shots (denoted by 1, 2, 3, 4, 5, and 6 of FIG. 6) from the left end to the right. Each of the second shot to the fifth shot is written by the beam of the shot size N'. Thereby, a plurality of beam shots in the first row are formed. Then, the second row of the rows arrayed in the y direction is formed by a plurality of successive beam shots (denoted by 7, 8, 9, 10, 11, and 12 of FIG. 6) from the left end to the right. Each of the eighth shot to the eleventh shot is written by the beam of the shot size N'. Thereby, a plurality of beam shots in the second row are formed. Shooting is subsequently repeated in a similar way, and thereby the reference line pattern is configured by a combination of patterns, formed by a plurality of beam shots, arrayed in the y direction orthogonal to the width dimension $D_0$ in the x direction. It is possible to further reduce positional deviation resulting from shortage of the settling time, by lessening the amount of deflection movement by making the shot size N' of the dummy shots to write the space between both the ends smaller than the shot size N of shots at both the ends.

Next, while variably setting the settling time of the DAC amplifier 130 to be a plurality of times $T_x$ (second time) which are different from each other, an evaluation pattern is formed in a manner such that both the ends of the width dimension $D_0$ being the same design width as that of the reference pattern 60 (or reference pattern 62) are written by two successive beam shots, by deflecting the electron beam 200 onto the target object 101 by the sub deflector 209, for each time $T_x$ having been variably set, such that the amount of deflection movement of successive two shots is equivalent to an evaluation deflection movement amount Q for evaluating the settling time of the DAC amplifier 130.

First, in the settling time setting step (S104), the settling time T setting unit 112 sets an initial value for the settling time $T_x$ (second time) to the DAC amplifier 130. Here, the settling time $T_x$ for forming an evaluation pattern whose deflection movement amount is Q is set. Since the settling time $T_x$ is variably set, an initial value is to be set first. The initial value may be, for example, a value assumed to be insufficient (short) for the settling time for the deflection movement amount Q. The optimal value can be obtained by gradually variably increasing (lengthening).

In the evaluation pattern writing step (S105), by deflecting the electron beam 200 onto the target object 101 by the sub deflector 209 to be deflected by the evaluation deflection movement amount Q in the settling time $T_x$ having been set, an evaluation pattern is written (formed) such that both the ends of the width dimension $D_0$ are written by two successive beam shots.

Figure 7:
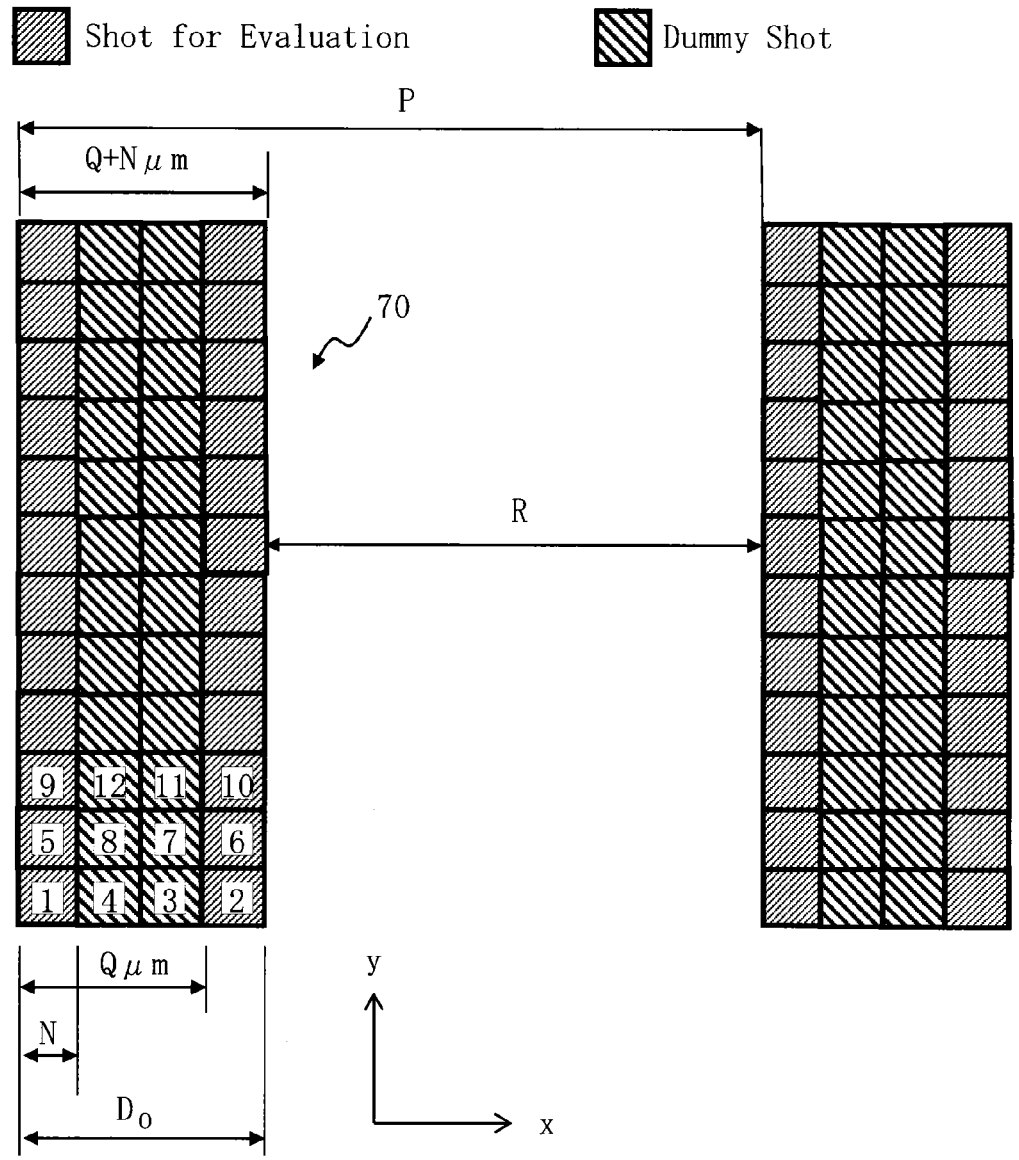
FIG. 7 shows an example of an evaluation pattern according to the first embodiment.

FIG. 7 shows an example of an evaluation pattern according to the first embodiment. In FIG. 7, an evaluation pattern 70 is designed and set to have a width dimension $D_0$ equivalent to four shots of the electron beam, for example. The width dimension $D_0$ is set to be four times the width size N (shot size) of the electron beam of each shot, and therefore the width dimension $D_0$ is 4N. In this case, the pitch (a deflection movement amount of a second beam shot of two beam shots) between the two shots that form both the ends of the evaluation pattern 70 is assumed to be a deflection movement amount Q for evaluation (evaluation deflection movement amount). In other words, the width dimension $D_0$ is a value obtained by adding the deflection movement amount Q and the beam width size N for one shot, that is $D_0=Q+N$. For example, if N=0.1 μm, Q and $D_0$ are to be Q=0.3 μm and $D_0$=0.4 μm in the case of FIG. 7 as in FIGS. 4 to 6. Although the deflection movement amount Q is set to be 3N in the example of FIG. 7, it is not limited thereto, and may be larger or smaller than 3N. It is preferable for the shot size N to be large in the case of Q=N, for example.

Both the ends of the width dimension $D_0$ in the x direction of the evaluation pattern 70 are formed by successive two beam shots. After shooting the both ends, the in-between space is shot. For example, the in-between space is written by two beam shots. Each beam of the four shots is shot such that the end portion of each beam contacts that of an adjacent beam. In the example of FIG. 7, after the first beam shot onto the left end of the first row of the rows arrayed in the y direction, (that is the shot denoted by "1" in FIG. 7), continuously, the second beam shot is shot onto the right end, (that is the shot denoted by "2" in FIG. 7). The settling time T in shooting the second beam shot located away from the first shot by the deflection movement amount Q is an evaluation target. Then, after the second beam shot, the space between both the ends is shot by the third and fourth beam shots (that is the shots denoted by "3 and 4" in FIG. 7) from the right side to the left side. Thereby, the pattern in the first row is formed. After forming the shots at both the ends, it is preferable to start shooting to write the space between both the ends from the left or right end side depending upon which the movement amount becomes smaller. Since the shots to write the space between both the ends are dummy shots, their accuracy may not be perfect. As to the second row of the rows arrayed in the y direction, after the fifth beam shot onto the left end of the second row, (that is the shot denoted by "5" in FIG. 7), continuously, the sixth beam shot is shot onto the right end, (that is the shot denoted by "6" in FIG. 7). The settling time T in shooting the sixth beam shot located away from the fifth shot by the deflection movement amount Q is an evaluation target. Then, after the sixth beam shot, the space between both the ends is shot by the seventh and eighth beam shots (that is the shots denoted by "7 and 8" in FIG. 7) from the right side to the left side. Thereby, the pattern in the second row is formed. Shooting is subsequently repeated in a similar way, and thereby the evaluation pattern is configured by a combination of patterns, formed by a plurality of beam shots, arrayed in the y direction orthogonal to the width dimension $D_0$ in the x direction.

Pattern data of a chip 2 on which the evaluation pattern 70 is formed is input from the outside and stored in the storage device 140. In order to write the chip pattern of the chip 2, the writing apparatus 100 operates as described below. First, the writing data processing unit 114 reads pattern data (writing data 2) of the chip 2 from the storage device 140, and performs data conversion processing of a plurality of steps so as to generate apparatus-specific shot data. The pattern data of the chip 2 defines the evaluation pattern 70 shown in FIG. 7. Then, in order to write figure patterns by the writing apparatus 100, it needs to divide the evaluation pattern 70 defined in the pattern data of the chip 2 into sizes each of which can be irradiated by one beam shot. Thus, for actually performing writing, the writing data processing unit 114 divides each figure pattern into shot sizes each being N that can be irradiated by one beam shot in order to generate shot figures. Shot data is generated for each shot figure. In the shot data, for example, figure data such as a figure type, a figure size, and an irradiation position is defined. In addition, an irradiation time in accordance with a dose is also defined. The generated shot data is sorted in the storage device 142. In the case of FIG. 7, the evaluation pattern 70 is divided into a plurality of quadrangular shot figures.

Next, the writing control unit 116 controls the deflection control circuit 120 and the control circuit 122 to output a control signal so that writing processing of shot data corresponding to the chip pattern of the chip 2 may be performed. In the deflection control circuit 120, shot data is read from the storage device 142 to generate main deflection data and sub deflection data for each shot figure, in accordance with irradiation position data defined in the shot data. The main deflection data is output to the DAC amplifier 132, and the sub deflection data is output to the DAC amplifier 130. At this time, a control signal is output to the DAC amplifier 130 so that the settling time T of the DAC amplifier 130 may be equivalent to the time $T_x$ described above and set respectively. The deflection control circuit 120 generates blanking data, for each shot figure, according to the irradiation time defined in the shot data, and outputs the blanking data to a DAC amplifier for blanking (not shown). Moreover, the deflection control circuit 120 generates shaping data according to the figure type and figure size defined in the shot data, and outputs the shaping data to a DAC amplifier for beam shaping (not shown). Then, based on a signal from each DAC amplifier controlled by the control circuit 122 and the deflection control circuit 120, the writing unit 150 writes a figure patternconcerned on the target object 100 with the electron beam 200. Concrete operations are the same as those of writing the reference pattern 60, except for the order of writing.

In the determination step (S106), the determination unit 117 determines whether the time $T_x$ has been changed to Tmax. When changed, it proceeds to the development step (S108). When the time not having been changed still remains, it proceeds to the settling time change step (S107).

In the settling time change step (S107), the settling time T change unit 119 changes the settling time $T_x$ (second time) to time $T_x+\alpha$, and sets the settling time $T_{x+}\alpha$ for the DAC amplifier 130, as a new settling time $T_x$ (second time). Then, it returns to the evaluation pattern writing step (S105).

In the evaluation pattern writing step (S105), by deflecting the electron beam 200 onto the target object 101 by the sub deflector 209 to be deflected by the evaluation deflection movement amount Q in the settling time $T_x$ having been newly set, an evaluation pattern is written (formed) such that both the ends of the width dimension $D_0$ are written by two successive beam shots. When writing an evaluation pattern in the settling time $T_x$ set as the n-th one, it should be written at the position which is displaced by the pitch P, for example, in the x direction from the evaluation pattern written in the settling time $T_x$ set as the (n−1)th one as shown in FIG. 7. The distance R between the (n−1)th evaluation pattern and the n-th evaluation pattern is to be set as the distance based on which the (n−1)th evaluation pattern and the n-th evaluation pattern can be discriminated by a dimension measurement apparatus.

The above settling time change step (S107), evaluation pattern writing step (S105), and determination step (S106) are repeated until the settling time $T_x$ has been changed to the Tmax.

Figure 8:
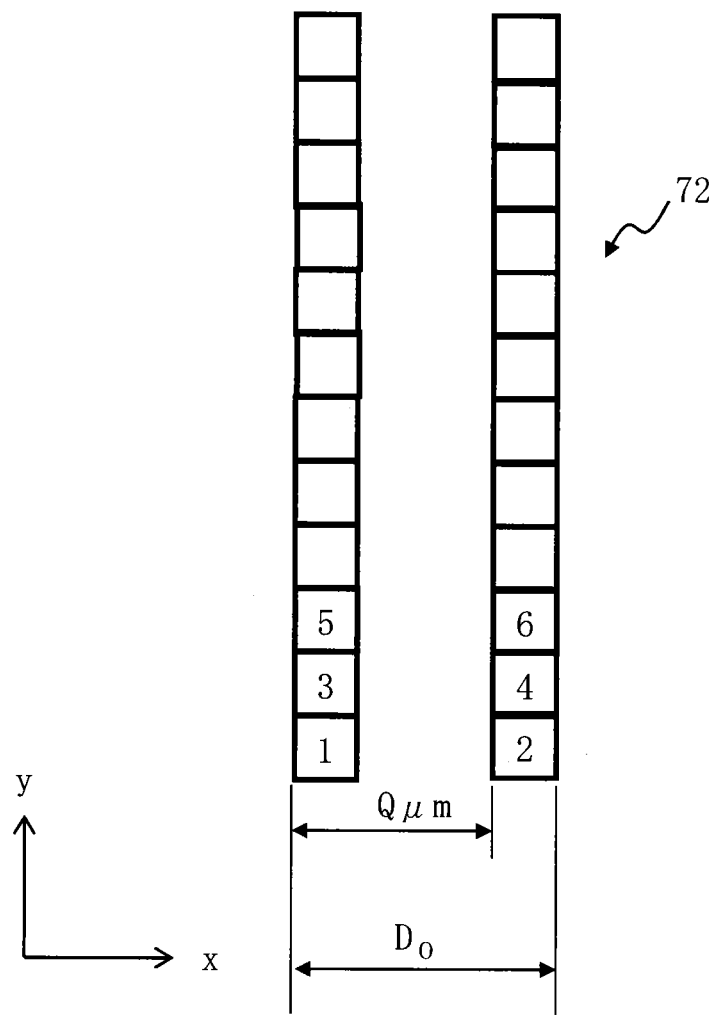
FIG. 8 shows another example of the evaluation pattern according to the first embodiment.

FIG. 8 shows another example of the evaluation pattern according to the first embodiment. In FIG. 8, an evaluation pattern 72 is configured by line patterns of two columns in the y direction. The pitch of these two line patterns is set to be the deflection movement amount Q for evaluation (evaluation deflection movement amount). The width dimension between both the ends of the evaluation pattern 72 configured by line patterns of the two columns is set to be the width dimension $D_0$ equivalent to, for example, four shots of electron beam as in FIG. 7. The width dimension $D_0$ is set to be four times the width size N (shot size) of the electron beam of each shot, and therefore the width dimension $D_0$ is 4N. As for the evaluation pattern 72 in the case of FIG. 8, a space pattern (no beam shot space) is formed between the two shots at both the ends of the width dimension $D_0$.

Both the ends of the width dimension $D_0$ in the x direction of the evaluation pattern 72 are formed by two successive beam shots. After shooting the both ends, the in-between space pattern remains without being shot to write. In the example of FIG. 8, after the first beam shot onto the left end of the first row of rows arrayed in the y direction, (that is the shot denoted by "1" in FIG. 8), continuously, the second beam shot is shot onto the right end, (that is the shot denoted by "2" in FIG. 8). The settling time T in shooting the second beam shot located away from the first shot by the deflection movement amount Q is an evaluation target. Thereby, the pattern in the first row is formed. As to the second row of the rows arrayed in the y direction, after the third beam shot onto the left end of the second row, (that is the shot denoted by "3" in FIG. 8), continuously, the fourth beam shot is shot onto the right end, (that is the shot denoted by "4" in FIG. 8). The settling time T in shooting the fourth beam shot located away from the third shot by the deflection movement amount Q is an evaluation target. Thereby, the pattern in the second row is formed. Shooting is subsequently repeated in a similar way, and thereby the evaluation pattern is configured by a combination of patterns, formed by a plurality of beam shots, arrayed in the y direction orthogonal to the width dimension $D_0$ in the x direction.

The in-between space between both the ends may be written by dummy shots as shown in FIG. 7, or alternatively may be a space pattern without being written.

In the development step (S108), the target object 101 on which the reference pattern 60 (alternatively 62 or 64) and a plurality of evaluation patterns 70 (or 72) formed by variably setting the settling time $T_x$ are written is developed. Thereby, a resist pattern is formed on which the reference pattern 60 (alternatively 62 or 64) and a plurality of evaluation patterns 70 (or 72) formed by variably setting the settling time $T_x$ are formed.

In the etching step (S110), etching is conducted using the resist pattern remains on the target object 101, as a mask. A shielding film such as chromium (Cr) should be formed on the whole surface of the target object 101 in advance, and a resist film is to be applied thereon. By performing the etching step (S110), the reference pattern 60 (alternatively 62 or 64) and a plurality of evaluation patterns 70 (or 72) formed by variably setting the settling time $T_x$ are formed, made of the shielding film, on the target object 101.

In the measurement step (S112), the width dimension between both the ends of each of the reference pattern 60 (alternatively 62 or 64) and a plurality of evaluation patterns 70 (or 72) formed by variably setting the settling time $T_x$ is measured using a dimension measurement apparatus. In other words, the width dimension of the evaluation pattern is measured for each settling time $T_x$ (second time) set variably.

In the difference LCD calculation step (S114), for each settling time $T_x$ (second time) set variably, a difference LCD between the width dimension of the evaluation pattern 70 (or 72) and the width dimension of the reference pattern 60 (alternatively 62 or 64) is calculated.

In the determination step (S116), the determination unit 118 determines whether the difference LCD is less than or equal to a threshold value.

Figure 9:
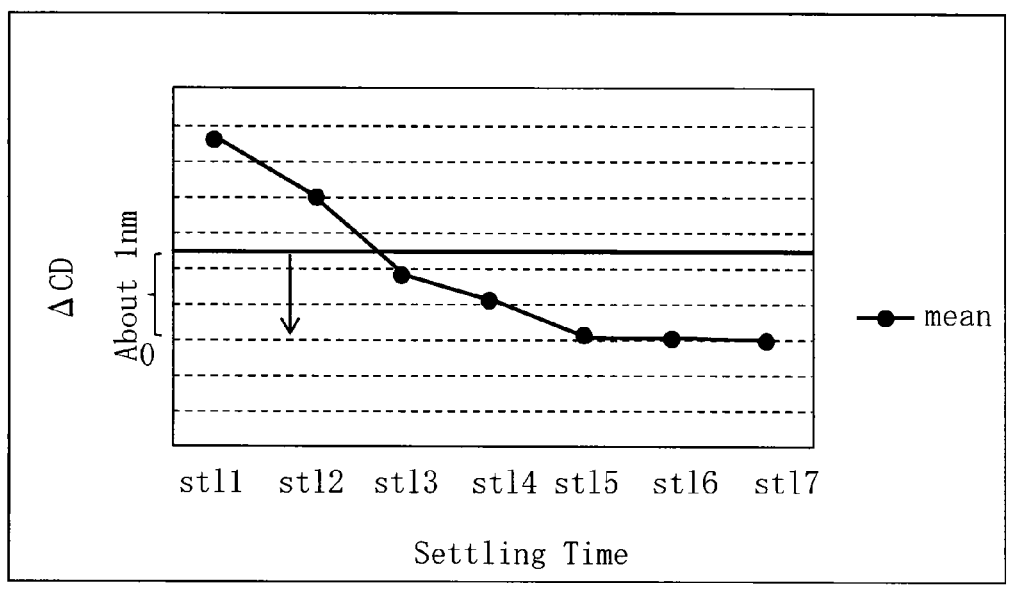
FIG. 9 is a graph showing an example of relation between a settling time and a difference ΔCD according to the first embodiment.
Figure 10:
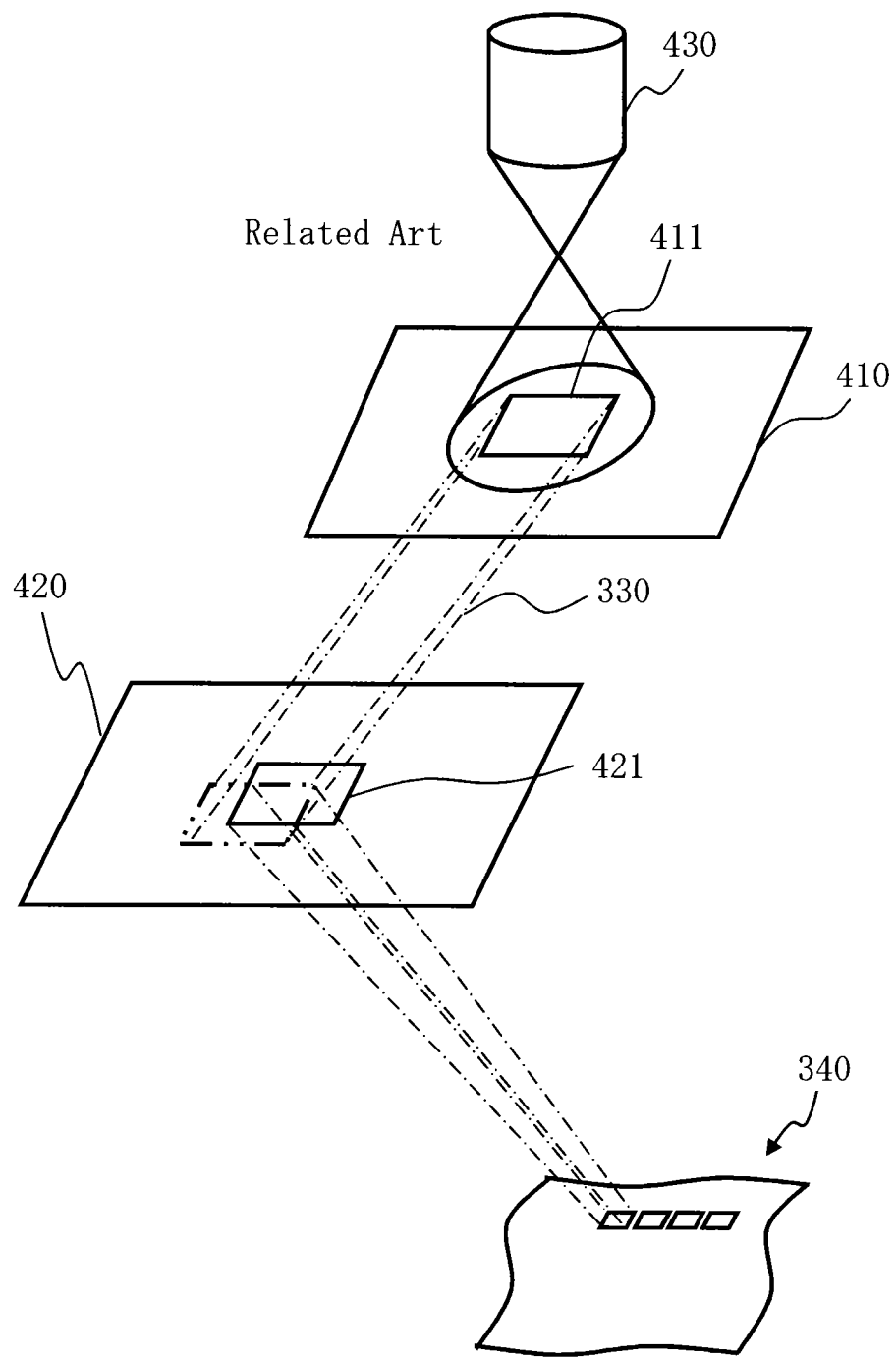
FIG. 10 is a conceptual diagram for explaining operations of a variable shaped electron beam writing apparatus.

FIG. 9 is a graph showing an example of relation between a settling time and a difference LCD according to the first embodiment. In FIG. 9, the ordinate axis shows the difference ΔCD between the width dimension of the evaluation pattern 70 (or 72) and the width dimension of the reference pattern 60 (alternatively 62 or 64). The abscissa axis shows the settling time of the DAC amplifier 130 at the time of writing the evaluation pattern 70 (or 72). In the example of FIG. 9, the settling time $T_x$ is over the allowable value (threshold value) from st11 to st12, and below the allowable value (threshold value) after st13. In the case of FIG. 9, a plurality of evaluation patterns 70 (or 72) are generated for the same settling time $T_x$, and their mean value of the width dimension is used respectively.

In the settling time acquisition (determination) step (S118), using a difference LCD for each settling time $T_x$ (second time), the settling time T of the DAC amplifier 130 necessary for performing deflection by the deflection movement amount Q is acquired. That is, the time $T_x$ based on which the difference LCD is less than or equal to a threshold value is acquired. Then, the shortest time in the acquired times T, is obtained as the settling time T of the DAC amplifier 130.

Now, using a DAC amplifier whose settling time is sufficient for the deflection movement amount Q for evaluation, two reference lines are written to be located away from each other by the deflection movement amount Q. Then, evaluation line patterns of two columns corresponding to the two reference lines are written such that the end of one evaluation line pattern contacts the end of a corresponding adjacent reference line. Then, the width of a first combined pattern of the reference line and the evaluation line (evaluation line pattern), and the width of a second combined pattern of the reference line and the evaluation line, where the second combined pattern is formed at the position away from the first combined pattern by the deflection movement amount Q, are measured. A plurality of groups each composed of the first combined pattern and the second combined pattern are written by variably setting the settling time in writing the second evaluation line pattern. There is a method of acquiring the optimal settling time in which the settling time in writing the second evaluation line pattern in the case of the difference between the width dimension of the first combined pattern and the width dimension of the second combined pattern being below a threshold value is regarded as the optimal-value settling time. According to this method, it is inevitably necessary to write two combined patterns whenever the settling time to be evaluated is changed since the deflection movement amount to be evaluated extends over two combined patterns. By contrast, according to the first embodiment, since the reference line and the evaluation line pattern are formed separately, it is sufficient to form a reference line once. Furthermore, according to the method described above, since the deflection movement amount for evaluation extends over two combined patterns, it is necessary to set the distance between the two combined patterns to be greater than or equal to the resolution limit of a dimension measurement apparatus. Accordingly, there is a limit in making the deflection movement amount for evaluation smaller.

By contrast, according to the first embodiment, since the reference line and the evaluation line pattern are formed separately, the deflection movement amount for evaluation does not extend over two combined patterns. Therefore, the deflection movement amount Q to be evaluated can be made smaller than the case of evaluation using two combined patterns. Accordingly, it becomes possible to evaluate a settling time for a short movement amount which has been conventionally unmeasurable.

According to the embodiments described above, a more suitable settling time can be acquired while maintaining high accuracy of shot position precision of a pattern to be written.

Referring to specific examples, embodiments have been described above. However, the present invention is not limited to these examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for acquiring a settling time comprising:
   forming, using a deflector that deflects a charged particle beam based on a deflection signal from a DAC (digital/analog converter) amplifier, a reference pattern in a manner such that both ends of a width dimension of the reference pattern are written by two beam shots which are different from each other, by setting a settling time of the DAC amplifier to be a first time and deflecting the charged particle beam onto a target object by the deflector so that a deflection movement amount of the charged particle beam is smaller than an evaluation deflection movement amount for evaluating the settling time of the DAC amplifier;
   forming, while variably setting the settling time of the DAC amplifier to be a plurality of second times which are different from each other, an evaluation pattern in a manner such that both ends of a width dimension of the evaluation pattern being a same design width dimension as that of the reference pattern are written by two beam shots which are successively shot, by deflecting the charged particle beam onto the target object by the deflector, for each of the plurality of second times set variably, such that a deflection movement amount of a second beam shot of the two beam shots which are successively shot is equivalent to the evaluation deflection movement amount for evaluating the settling time of the DAC amplifier;
   measuring the width dimension of the reference pattern;
   measuring the width dimension of the evaluation pattern for the each of the plurality of second times set variably;
   calculating a difference between the width dimension of the evaluation pattern concerned and the width dimension of the reference pattern, for the each of the plurality of second times set variably; and
   acquiring a settling time of the DAC amplifier necessary for performing deflection by the deflection movement amount, using the difference for the each of the plurality of second times.

2. The method according to claim 1, wherein
   a reference line of the reference pattern is configured by a combination of patterns, formed by a plurality of beam shots, arrayed in a direction orthogonal to the width dimension, and
   the reference line is formed by shooting a charged particle beam in order such that the charged particle beam is moved in the direction orthogonal to the width dimension.

3. The method according to claim 2, wherein
   the reference line is formed by successive shots contacting each other in the direction orthogonal to the width dimension.

4. The method according to claim 1, wherein
   in the evaluation pattern, a space pattern is formed between the two beam shots at the both ends of the width dimension.

5. The method according to claim 1, wherein
   the reference pattern is formed by three or more beam shots in a direction of the width dimension of the reference pattern, and
   a space between the two beam shots writing the both ends of the width dimension of the reference pattern is written by a beam whose shot size is smaller than a shot size of each of the two beam shots at the both ends.

6. The method according to claim 1, wherein the width dimension of the evaluation pattern is a sum of the deflection movement amount of the second beam shot of the two beam shots which are successively shot and a beam width dimension of the second beam shot of the two beam shots.

7. The method according to claim 6, wherein the width dimension of the reference pattern is a sum of a beam width dimension of each of a plurality of successive beam shots each whose deflection movement amount is set to be the beam width dimension.

8. The method according to claim 7, wherein in the evaluation pattern, after the two beam shots at the both ends of the width dimension, a space between the two beam shots is written by at least one of a third and subsequent beam shots of the plurality of successive beam shots.

9. The method according to claim 7, wherein the reference pattern is written by the plurality of successive beam shots in which adjacent beam shots contact each other.

10. The method according to claim 6, wherein the width dimension of the reference pattern is a sum of a beam width dimension of each of a plurality of unsuccessive beam shots each whose deflection movement amount is set to be the beam width dimension.

\* \* \* \* \*